US006558969B2

(12) United States Patent
Miller et al.

(10) Patent No.: US 6,558,969 B2
(45) Date of Patent: May 6, 2003

(54) FLUID-JET PRINTHEAD AND METHOD OF FABRICATING A FLUID-JET PRINTHEAD

(75) Inventors: Richard Todd Miller, Corvallis, OR (US); Susanne L. Kumpf, Corvallis, OR (US)

(73) Assignee: Hewlett-Packard Development Company, Palo Alto, CA (US)

( * ) Notice: Subject to any disclaimer, the term of this patent is extended or adjusted under 35 U.S.C. 154(b) by 0 days.

(21) Appl. No.: 10/225,702

(22) Filed: Aug. 21, 2002

(65) Prior Publication Data

US 2003/0001928 A1 Jan. 2, 2003

Related U.S. Application Data

(62) Division of application No. 09/772,410, filed on Jan. 29, 2001, now Pat. No. 6,457,815.

(51) Int. Cl.[7] ................................................ H01L 21/00

(52) U.S. Cl. ............................................ 438/21; 347/62

(58) Field of Search ................................ 438/21; 347/1, 347/61, 62

(56) References Cited

U.S. PATENT DOCUMENTS

| | | | |
|---|---|---|---|
| 4,513,298 | A | 4/1985 | Scheu |
| 4,602,421 | A | 7/1986 | Lee et al. |
| 4,956,653 | A | 9/1990 | Braun |
| 5,159,353 | A | 10/1992 | Fasen et al. |
| 5,159,430 | A | 10/1992 | Manning et al. |
| 5,232,865 | A | 8/1993 | Manning et al. |
| 5,330,930 | A | 7/1994 | Chi |
| 5,459,501 | A | 10/1995 | Lee et al. |
| 5,500,553 | A | 3/1996 | Ikegami |
| 5,744,846 | A | 4/1998 | Batra et al. |
| 5,870,121 | A | 2/1999 | Chan |
| 5,883,650 | A | 3/1999 | Figueredo et al. |
| 5,981,329 | A | 11/1999 | Batra et al. |
| 5,998,276 | A | 12/1999 | Batra et al. |
| 6,008,082 | A | 12/1999 | Rolfson et al. |
| 6,023,091 | A | 2/2000 | Koch et al. |
| 6,979,811 | | 6/2000 | Cornell et al. |

FOREIGN PATENT DOCUMENTS

| | | | |
|---|---|---|---|
| EP | 0514706 | A2 | 11/1992 |
| EP | 0603821 | A2 | 6/1994 |
| EP | 0674995 | A2 | 10/1995 |
| JP | 401110157 | A | 4/1989 |
| JP | 10119341 | | 5/1998 |

*Primary Examiner*—John F. Niebling
*Assistant Examiner*—Christopher Lattin
(74) *Attorney, Agent, or Firm*—Timothy F. Myers

(57) ABSTRACT

A fluid-jet printhead has a substrate on which at least one layer defining a fluid chamber for ejecting fluid is applied. The printhead includes an elevation layer disposed on the substrate and aligned with the fluid chamber. The printhead also includes a resistive layer disposed between the elevation layer and the substrate wherein the resistive layer has a smooth planer surface interfacing with the resistive layer.

9 Claims, 9 Drawing Sheets

— *PRIOR ART* —

FLUID-JET PRINTHEAD AND METHOD OF FABRICATING A FLUID-JET PRINTHEAD

CROSS REFERENCE TO RELATED APPLICATION(S)

This is a divisional of application Ser. No. 09/772,410 filed Jan. 29, 2001 now U.S. Pat. No. 6,457,815, which is hereby incorporated by reference herein.

THE FIELD OF THE INVENTION

This invention relates to the manufacturer of printheads used in fluid-jet printers, and more specifically to a fluid-jet printhead used in a fluid-jet print cartridge having improved dimensional control and improved step coverage.

BACKGROUND OF THE INVENTION

One type of fluid-jet printing system uses a piezoelectric transducer to produce a pressure pulse that expels a droplet of fluid from a nozzle. A second type of fluid-jet printing system uses thermal energy to produce a vapor bubble in a fluid-filled chamber that expels a droplet of fluid. The second type is referred to as thermal fluid-jet or bubble jet printing systems.

Conventional thermal fluid-jet printers include a print cartridge in which small droplets of fluid are formed and ejected towards a printing medium. Such print cartridges include fluid-jet printheads with orifice structures having very small nozzles through which the fluid droplets are ejected. Adjacent to the nozzles inside the fluid-jet printhead are fluid chambers, where fluid is stored prior to ejection. Fluid is delivered to fluid chambers through fluid channels that are in fluid communication with a fluid supply. The fluid supply may be, for example, contained in a reservoir part of the print cartridge.

Ejection of a fluid droplet, such as ink, through a nozzle may be accomplished by quickly heating a volume of fluid within the adjacent fluid chamber. The rapid expansion of fluid vapor forces a drop of fluid through the nozzle in the orifice structure. This process is commonly known as "firing." The fluid in the chamber may be heated with a transducer, such as a resistor, that is disposed and aligned adjacent to the nozzle.

In conventional thermal fluid-jet printhead devices, such as ink-jet cartridges, thin film resistors are used as heating elements. In such thin film devices, the resistive heating material is typically deposited on a thermally and electrically insulating substrate. A conductive layer is then deposited over the resistive material. The individual heater element (i.e., resistor) is dimensionally defined by conductive trace patterns that are lithographically formed through numerous steps including conventionally masking, ultraviolet exposure, and etching techniques on the conductive and resistive layers. More specifically, the critical width dimension of an individual resistor is controlled by a dry etch process. For example, an ion assisted plasma etch process is used to etch portions of the conductive and resistive layers not protected by a photoresist mask. The width of the remaining conductive thin film stack (of conductive and resistive layers) defines the final width of the resistor. The resistive width is defined as the width of the exposed resistive layer between the vertical walls of the conductive layer. Conversely, the critical length dimension of an individual resistor is controlled by a subsequent wet etch process. A wet etch process is used to produce a resistor having sloped walls on the conductive layer defining the resistor length. The sloped walls of the conductive layer permit step coverage of later fabricated layers.

As discussed above, conventional thermal fluid-jet printhead devices require both dry etch and wet etch processes. The dry etch process determines the width dimension of an individual resistor, while the wet etch process defines both the length dimension and the necessary sloped walls commencing from the individual resistor. As is well known in the art, each process requires numerous steps, thereby increasing both the time to manufacture a printhead device and the cost of manufacturing a printhead device.

One or more passivation and cavitation layers are fabricated in a stepped fashion over the conductive and resistive layers and then selectively removed to create a via for electrical connection of a second conductive layer to the conductive traces. The second conductive layer is pattered to define a discrete conductive path from each trace to an exposed bonding pad remote from the resistor. The bonding pad facilitates connection with electrical contacts on the print cartridge. Activation signals are provided from the printer to the resistor via the electrical contacts.

Further, the wet etching process for defining the resistor length suffers from uniformity issues and can be highly dependent upon the chemistries used. The first conductive layer may be vulnerable to corrosion through pinholes and cracks in the passivation layers during subsequent wet etches.

The printhead substructure is overlaid with at least one orifice layer. Preferably, the at least one orifice layer is etched to define the shape of the desired firing fluid chamber within the at least one orifice layer. The fluid chamber is situated above, and aligned with, the resistor. The at least one orifice layer is preferably formed with a polymer coating or optionally made of an fluid barrier layer and an orifice plate. Other methods of forming the orifice layer(s) are know to those skilled in the art.

In direct drive thermal fluid-jet printer designs, the thin film device is selectively driven by electronics preferably integrated within the thermal electric integrated circuit part of the printhead substructure. The integrated circuit conducts electrical signals directly from the printer microprocessor to the resistor through conductive layers. The resistor increases in temperature and creates super-heated fluid bubbles for ejection of the fluid from the chamber through the nozzle. However, conventional thermal fluid-jet printhead devices can suffer from inconsistent and unreliable fluid drop sizes and inconsistent turn on energy required to fire a fluid droplet, if the resistor dimensions are not tightly controlled. Further, the stepped regions within the fluid chamber can affect drop trajectory and device reliability. The device reliability is affected by the bubble collapsing after the drop ejection thereby wearing down the stepped regions.

It is desirous to fabricate a fluid-jet printhead capable of producing fluid droplets having consistent and reliable fluid drop sizes and less susceptible to corrosion. In addition, it is desirous to fabricate a fluid-jet printhead having a consistent turn on energy (TOE) required to fire a fluid droplet, thereby providing greater control of the size of the fluid drops.

SUMMARY OF THE INVENTION

A fluid-jet printhead has a substrate on which at least one layer defining a fluid chamber for ejecting fluid is applied. The printhead includes an elevation layer disposed on the substrate and aligned with the fluid chamber. The printhead also includes a resistive layer disposed between the elevation layer and the substrate wherein the resistive layer has a smooth planer surface interfacing with the resistive layer.

The present invention provides numerous advantages over conventional thin film printheads. First, the present invention provides a structure capable of firing a fluid droplet in a direction substantially perpendicular (normal or orthogonal) to a plane defined by the formed resistive element and ejection surface of the printhead. Second, the dimensions and planarity of the resistive material layer are more precisely controlled, which reduces the variation in the turn on energy required to fire a fluid droplet. Third, the size of a fluid droplet is better controlled due to less variation in resistor size. Fourth, the corrosion resistance and electromigration resistance of the conductive layers are improved inherently by the design.

DESCRIPTION OF THE PREFERRED EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined only by the appended claims.

The present invention is a fluid-jet printhead, a method of fabricating the fluid-jet printhead, and use of a fluid-jet printhead. The present invention provides numerous advantages over the conventional fluid-jet or ink-jet printheads. First, the present invention provides a structure capable of firing a fluid droplet in a direction substantially perpendicular (normal or orthogonal) to a plane defined by the formed resistive element and ejection surface of the printhead. Second, the dimensions and planarity of the resistive layer are more precisely controlled, which reduces the variation in the turn on energy required to fire a fluid droplet. Third, the size of a fluid droplet is better controlled due to less variation in resistor size. Fourth, the design inherently provides for improved corrosion resistance and improved electromigration resistance of the conductive layers.

Figure 1:
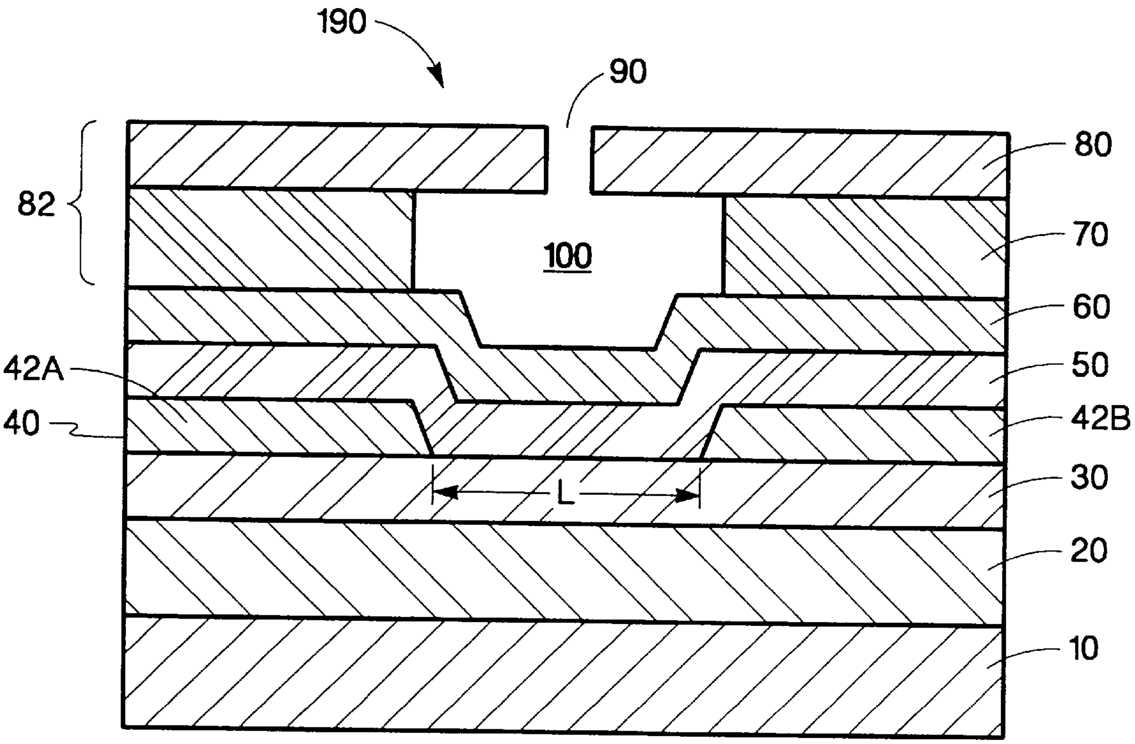
FIG. 1 is an enlarged, cross-sectional, partial view illustrating an exemplary conventional thin film printhead substructure.

FIG. 1 is an enlarged, cross-sectional, partial view illustrating a conventional thin film printhead 190. The thicknesses of the individual thin film layers are not drawn to scale and are drawn for illustrative purposes only. As shown in FIG. 1, thin film printhead 190 has affixed to it a fluid barrier layer 70, which is shaped along with orifice plate 80 to define fluid chamber 100 to create an orifice layer 82 (see FIG. 5). Optionally, the orifice layer 82 and fluid barrier layers 70 may be made of one or more layers of polymer material. Additionally, other methods of forming a fluid chamber and orifice opening are known to those skilled in the art and can be substituted without departing from the scope and spirit of the invention. A fluid droplet within a fluid chamber 100 is rapidly heated and fired through nozzle 90 when the printhead is used.

Thin film printhead substructure 190 includes a substrate 10, an insulating insulator layer 20, a resistive layer 30, a conductive layer 40 (including conductors 42A and 42B), a passivation layer 50, a cavitation layer 60, and a fluid barrier structure 70 defining fluid chamber 100 with orifice plate 80.

Figure 2:
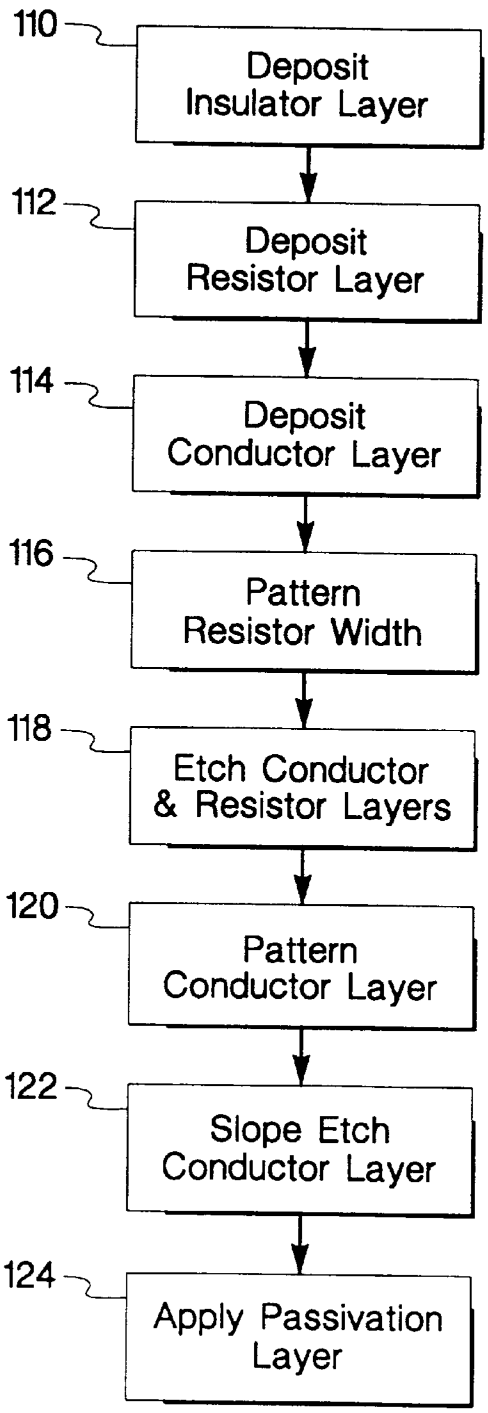
FIG. 2 is a flow chart of an exemplary process used to implement the conventional thin film printhead structure.

As diagrammed in FIG. 2, an insulator layer 20 (also referred to as an insulative dielectric) is applied to substrate 10 in step 110 preferably by deposition. Silicon dioxides are examples of materials that are used to fabricate insulator layer 20. In one embodiment, insulator layer 20 is formed from tetraethylorthosilicate (TEOS) oxide having a 14,000 Angstrom thickness. In an alternative embodiment, insulative layer 20 is fabricated from silicon dioxide. In another alternative embodiment, it is formed of silicon nitride.

There are numerous ways to fabricate insulation layer 20, such as through a plasma enhanced chemical vapor deposition (PECVD) or a thermal oxide process. Insulator layer 20 serves as both a thermal and electrical insulator for the resistive circuit that will be built on its surface. The thickness of the insulator layer can be adjusted to vary the heat transferring or isolating capabilities of the layer depending on a desired turn-on energy and firing frequency.

Next in step 112, the resistive layer 30 is applied to uniformly cover the surface of insulation layer 20. Preferably, the resistive layer is tantalum silicon nitride or tungsten silicon nitride of a 1200 Angstrom thickness although tantalum aluminum can also be used. Next in step 114, conductive layer 40 is applied over the surface of resistive layer 30. In conventional structures, conductive layer 40 is formed with preferably aluminum copper or alternatively with tantalum aluminum or aluminum gold. Additionally, a metal used to form conductive layer 40 may also be doped or combined with materials such as copper, gold, or silicon or combinations thereof. A preferable thickness for the conductive layer 40 is 5000 Angstroms. Resistive layer 30 and conductive layer 40 can be fabricated though various techniques, such as through a physical vapor deposition (PVD).

In step 116, the conductive layer 40 is patterned with a photoresist mask to define the resistor's width dimension. Then in step 118, conductive layer 40 is etched to define conductors 42A and 42B. Fabrication of conductors 42A and 42B define the critical length and width dimensions of the active region of resistive layer 30. More specifically, the critical width dimension of the active region of resistive layer 30 is controlled by a dry etch process. For example, an ion assisted plasma etch process is used to vertically etch portions of conductive layer 40 and resistive layer 30 which are not protected by a photoresist mask, thereby defining a maximum resistor width as being equal to the width of conductors 42A and 42B. In step 120, the conductor layer is patterned with photoresist to define the resistor's length dimension defined as the distance between conductors 42A and 42B. In step 122, the critical length dimension of the active region of resistive layer 30 is controlled by a wet etch process. A wet etch process is used since it is desirable to produce conductors 42A and 42B having sloped walls, thereby defining the resistor length. The wet etch process used is chosen such that the etch is highly reactive to the conductive layer but minimally reactive to the resistive layer. Sloped walls of conductive layer 42A enables step coverage of later fabricated layers such as a passivation layer that is applied in step 124.

Conductors 42A and 42B serve as the conductive traces that deliver a signal to the active region of resistive layer 30 for firing a fluid droplet. Thus, the conductive trace or path for an electrical signal impulse that heats the active region of resistive layer 30 is from conductor 42A through the active region of resistive layer 30 to conductor 42B.

In step 124, passivation layer 50 is then applied uniformly over the device. There are numerous passivation layer designs incorporating various compositions. In one conventional embodiment, two passivation layers, rather than a single passivation layer are applied. In the conventional printhead example of FIG. 1, the two passivation layers comprise a layer of silicon nitride followed by a layer of silicon carbide. More specifically, the silicon nitride layer is deposited on conductive layer 40 and resistive layer 30 and then a silicon carbide is preferably deposited.

After passivation layer 50 is deposited, cavitation barrier 60 is applied. In the conventional example, the cavitation barrier comprises tantalum. A sputtering process, such as a physical vapor deposition (PVD) or other techniques known in the art deposits the tantalum. Fluid barrier layer 70 and orifice layer 80 are then applied to the structure, thereby defining fluid chamber 100. In one embodiment, fluid barrier layer 70 is fabricated from a photosensitive polymer and orifice layer 80 is fabricated from plated metal or organic polymers. Fluid chamber 100 is shown as a substantially rectangular or square configuration in FIG. 1. However, it is understood that fluid chamber 100 may include other geometric configurations without varying from the present invention.

Thin film printhead 190, shown in FIG. 1, illustrates one example of a typical conventional printhead. However, printhead 190 requires both a wet and a dry etch process in order to define the functional length and width of the active region of resistive layer 30, as chamber as to create the sloped walls of conductive layer 40 necessary for adequate step coverage of the later fabricated layers, such as the passivation 50 and cavitation 60 layers.

Figure 3A:
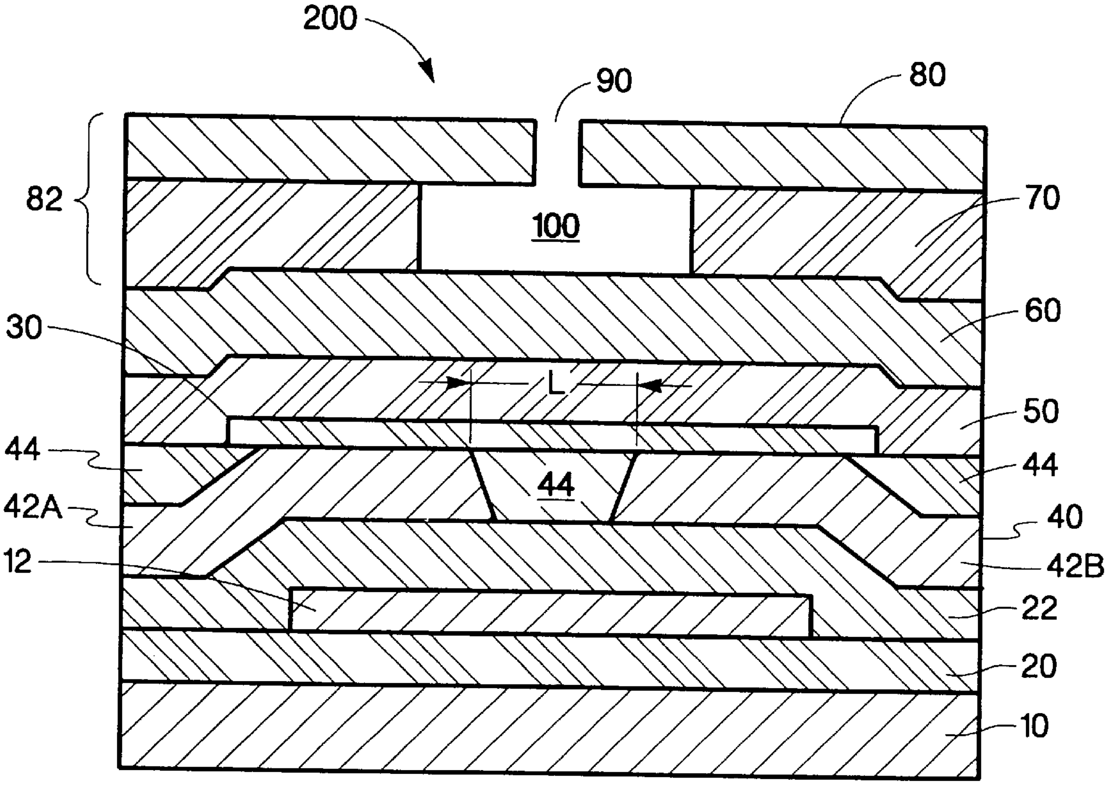
FIG. 3A is a cross-sectional, partial view illustrating a first embodiment of the invention's thin film printhead structure showing the resistor length dimension.
Figure 4:
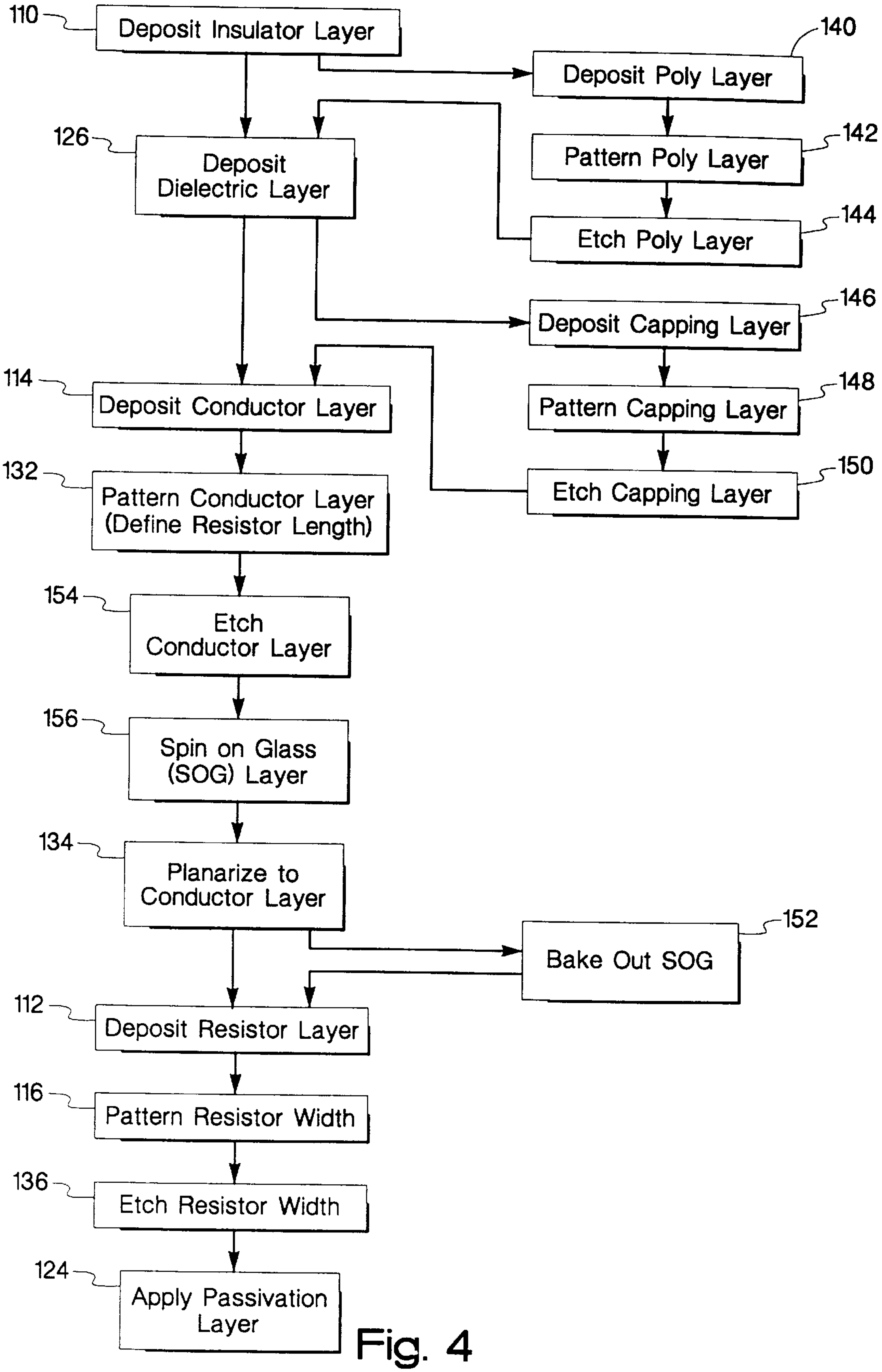
FIG. 4 is a flowchart of an exemplary process and optional steps used to implement several embodiments of the invention's thin-film printhead structure.
Figure 5:
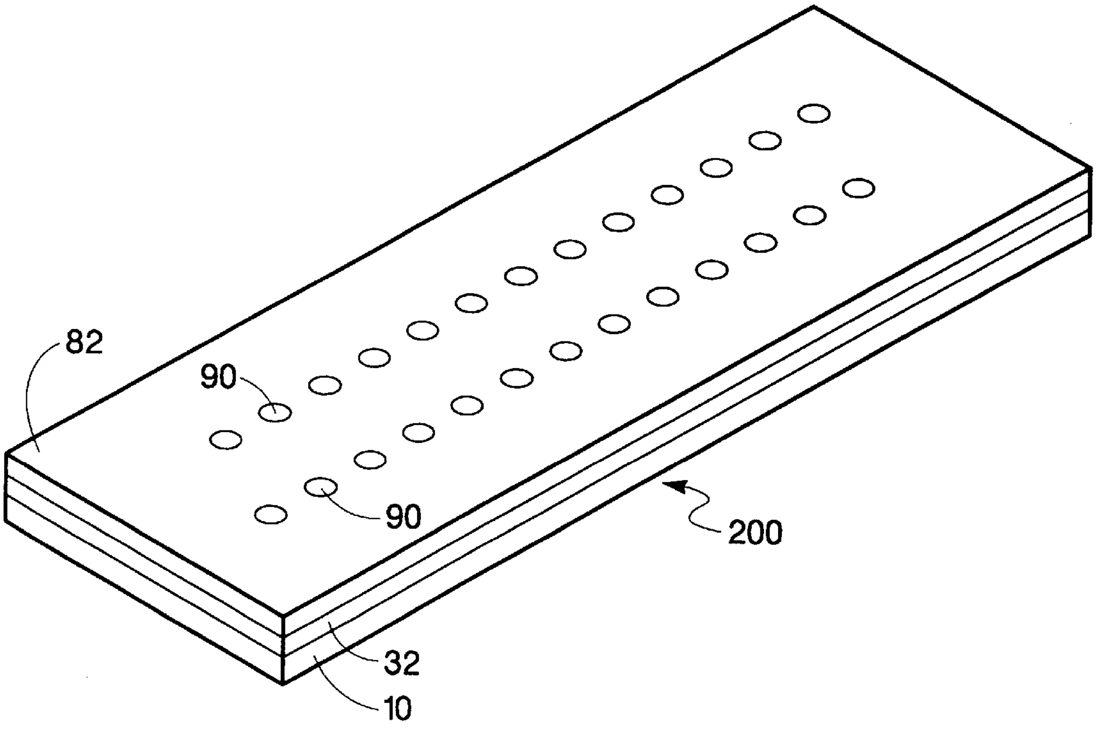
FIG. 5 is a perspective view of a printhead fabricated with the invention.

FIG. 3A is a cross-sectional, partial view illustrating the layers for a fluid-jet printhead 200 incorporating the present invention. The thicknesses of the individual thin film layers are not drawn to scale and are drawn for illustrative purposes only. FIG. 5 is an enlarged, plan view illustrating a fluid-jet printhead 200 incorporating the present invention. As shown in FIG. 4, in step 110, insulative layer 20 is fabricated by being deposited through any known means, such as a plasma enhanced chemical vapor deposition (PECVD), a low pressure chemical vapor deposition (LPCVD), an atmosphere pressure chemical vapor deposition (APCVD) or a thermal oxide process onto substrate 10. Preferably, insulator layer 20 is formed with field oxide or optionally from tetraethylorthosilicate (TEOS) oxide. In one alternative embodiment, insulative layer 20 is fabricated from silicon dioxide. In another embodiment, it is formed of silicon nitride.

In step 126, a dielectric material 22 is deposited onto the insulator layer. Preferably, the dielectric material 22 is formed of phosphosilicate glass (PSG). In an alternative embodiment, dielectric material 22 is formed from silicon nitride or TEOS. In an alternative embodiment dielectric material 22 is fabricated from silicon dioxide.

Alternatively, before step 126, a polysilicon layer 12 is deposited on the insulator area in step 140. The purpose of the polysilicon layer 12 is to provide a step in height to elevate the subsequent conductive layer 40 in the area of the resistor to allow the conductive layer 40 to make direct contact with the resistive layer without the need for vias. In step 142, the polysilicon layer 12 patterned by an appropriate mask. In step 144, the polysilicon layer 12 is etched and any photomask remaining striped to leave an area of polysilicon between the substrate and the subsequent formation of a fluid chamber.

Figure 3B:
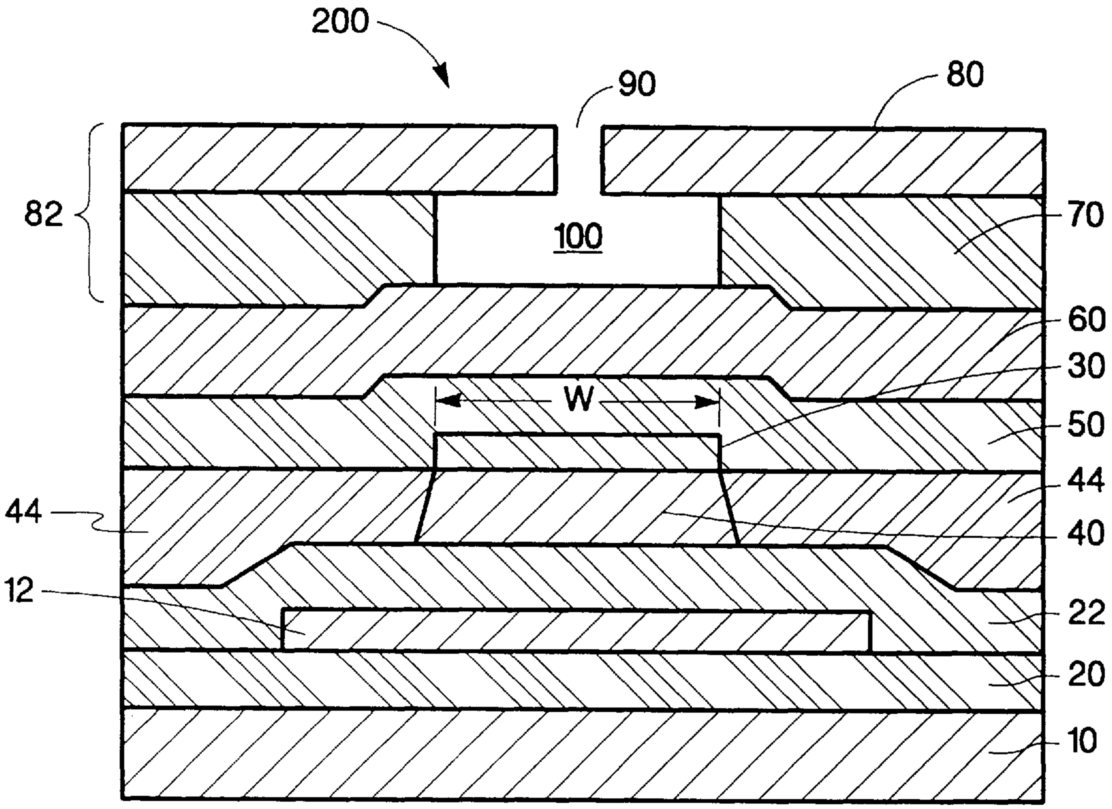
FIG. 3B is a cross-sectional, partial view illustrating the first embodiment of the invention's thin film printhead structure showing the resistor width dimension.
Figure 3C:
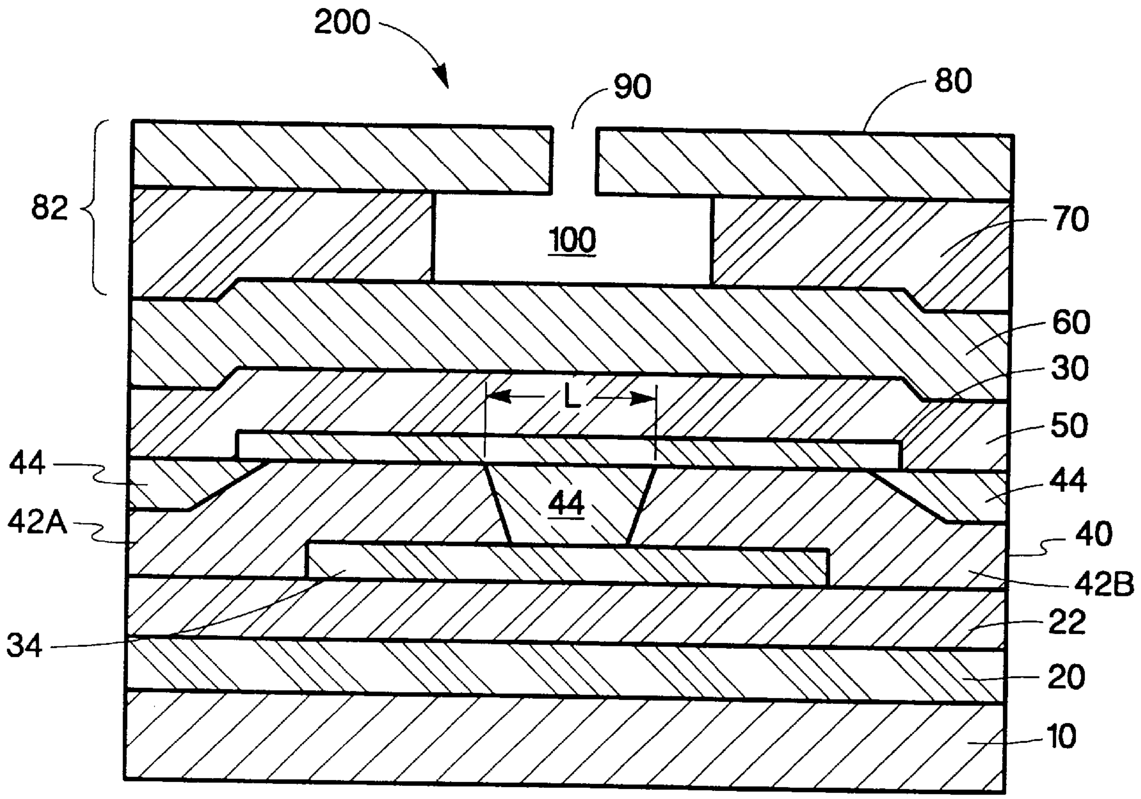
FIG. 3C is a cross-sectional, partial view illustrating a second embodiment of the invention's thin film printhead structure showing the resistor length dimension.

Alternatively as shown in FIG. 3C, after step 126, in step 146 a capping layer 34 for the conductive layer is deposited on the dielectric layer. In step 148, the capping layer 34 is patterned preferably by photoresist. In step 150, the capping layer 34 is etched to define an area between the resistor and the substrate. The capping layer 34 is preferably formed of dielectric material, such as TEOS or PSG, silicon nitride, or silicon dioxide, to name a few. The capping layer 34 allows for maintaining the thin-film interfaces of the conventional art printhead shown in FIG. 1. By maintaining the conventional thin-film interfaces, potential problems such as junction spiking and film interface reliability issues are reduced. Optionally, the capping layer 34 can be used in place of the polysilicon layer 12 to provide the step in height elevation of a subsequently applied conductive layer 40.

In step 114, conductive layer 40 is then fabricated on top of previously deposited layers. In one embodiment, conductive layer 40 is a layer formed through a physical vapor deposition (PVD) from aluminum and copper. More specifically, in one embodiment, conductive layer 40 includes up to approximately 2% percent copper in aluminum, preferably approximately 0.5 percent copper in aluminum. Utilizing a small percent of copper in aluminum limits electro-migration. In another preferred embodiment, conductive layer 40 is formed from titanium, copper, or tungsten.

In step 132, a photoimagable masking material such as a photoresist is deposited on portions of conductive layer 40, thereby exposing other portions of conductive layer 40. These masking and patterning steps are used to define the resistor length and conductive traces 42A and 42B that is determined by the mask detail.

In step 154, the conductor layer is dry etched to create conductive traces 42A and 42B and openings between the traces that define the resistor length.

In step 156, a second insulating layer 44, such as TEOS or spin-on-glass (SOG) is applied on the conductive layer 40, but preferably SOG. The second insulating layer 44 is used to fill between the conductor traces as well as the resistor length gap.

In step 134, the second insulating layer 44 is planarized preferably by using chemical mechanical polishing (CMP) to expose the elevated surface of conductive layer 40. In an alternative embodiment, the surface second insulating layer 44 is planarized through use of a resist-etch-back (REB) process. By using the optional polysilicon layer 12 to elevate conductive layer 40, the amount of conductive layer 40 exposed during the planarization of the Second insulating layer 44 is minimized. Further, only the segments of conductive layer 40 necessary for contact with the subsequently applied resistive layer 30 are exposed to the planarization process if an additional cap is used.

Optionally, in step 152 the second insulating layer 44 is baked out to remove moisture that might have an adverse affect on the subsequently applied resistive layer 30.

Next in step 112, the resistive layer 30 is applied to uniformly cover the surface of second insulating layer 44 and the desired resistor area. Preferably, the resistive layer 30 is tantalum aluminum although tungsten silicon nitride or tantalum silicon nitride can also be used.

In step 116, a photoimagable masking material such as a photoresist mask is deposited on resistive layer 30 to define the resistor area, thereby exposing portions of resistive layer 30 for removal.

In step 136, the exposed portion of resistive layer 30 is removed through either a dry etch process several of which are known to those skilled in the art such as described in step 118 of FIG. 2 or a wet etch process that is reactive to the resistive layer 30. This etching step 136 defines and forms the resistor width. The photoresist mask is then removed, thereby exposing the resistor element. The passivation 50, cavitation 60, barrier 70 and orifice 80 layers are then applied as described for the conventional printhead.

Conductors 42A and 42B provide an electrical connection/path between external circuitry and the formed resistive element. Therefore, conductors 42A and 42B transmit energy to the formed resistor element to create heat capable of firing a fluid droplet positioned on a top surface of the formed resistive element in a direction perpendicular to the top surface of the formed resistive element.

FIG. 3B is a cross-sectional, partial view illustrating the first embodiment of the invention's thin film printhead structure showing the resistor width dimension with respect to the thin-film layers applied to substrate 10 using the process steps of FIG. 4.

As shown in FIGS. 3A and 3B, conductive traces 42A and 42B define a resistor element between conductive traces 42A and 42B. Preferably, the formed resistive element has a length L equal to the distance between conductors 42A and 42B. Preferably, the formed resistive element has a width W as shown in FIG. 3B equal to the width of conductive traces 42A and 42B. However, it is understood that the formed resistive element may be fabricated having any one of a variety of configurations, shapes, or sizes, such as a thin trace or a wide trace of conductive traces 42A and 42B. The only requirement of the formed resistive element is that it contacts conductive traces 42A and 42B to ensure a proper electrical connection. While the actual length L of the formed resistive element is equal to or greater than the distance between the edges of conductor's 42A and 42B, the active portion of the formed resistive element which conducts heat to a droplet of fluid positioned above the formed resistive element corresponds to the distance between the edges of conductors 42A and 42B.

FIG. 3C is a cross-sectional, partial view illustrating a second embodiment of the invention in which the capping layer 34 is used to elevate the conductor layer 30 instead of the polysilicon layer 12 of FIG. 3A.

In FIG. 5, each orifice nozzle 90 is in fluid communication with respective fluid chambers 100 (shown enlarged in FIG. 2) defined in printhead 200. Each fluid chamber 100 is constructed in orifice structure 82 adjacent to thin film structure 32 that preferably includes a transistor coupled to the resistive component. The resistive component is selectively driven (heated) with sufficient electrical current to instantly vaporize some of the fluid in fluid chamber 100, thereby forcing a fluid droplet through nozzle 90.

Figure 6:
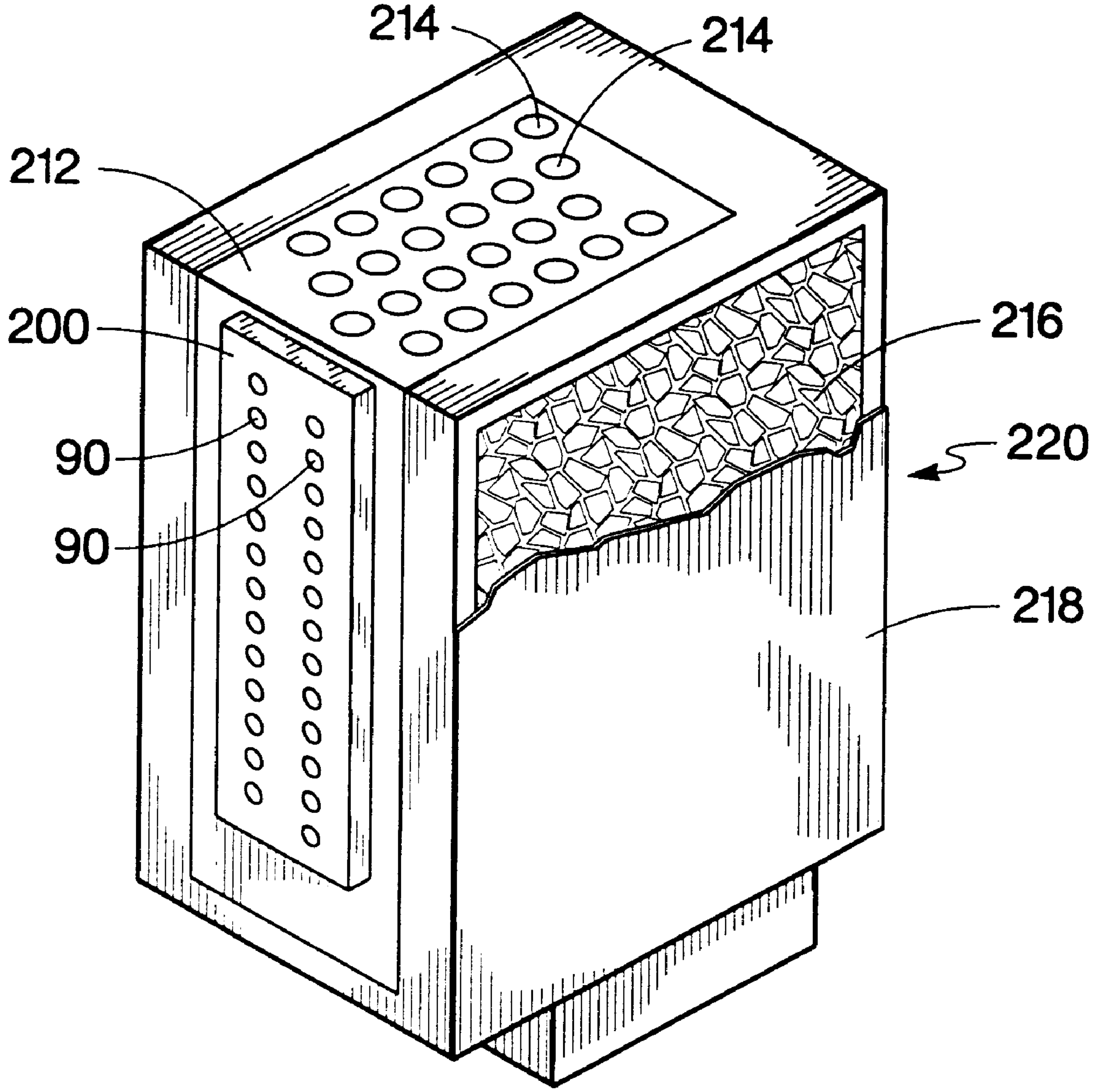
FIG. 6 is an exemplary print cartridge that integrates and uses the printhead of FIG. 5.

Exemplary thermal fluid-jet print cartridge 220 is illustrated in FIG. 6. The fluid-jet printhead device of the present invention is a portion of thermal fluid-jet print cartridge 220. Thermal fluid-jet print cartridge 220 includes body 218, flexible circuit 212 having circuit pads 214, and printhead 200 having orifice nozzles 90. Fluid is provided to fluid-jet print cartridge 220 by the use of body 218 configured in fluid connection using a fluid delivery system 216, shown as a sponge (preferably closed-cell foam), within fluid-jet print cartridge 220 or by means of a remote storage source in fluid connection with fluid-jet print cartridge 220. While flexible circuit 212 is shown in FIG. 6, it is understood that other electrical circuits known in the art may be utilized in place of flexible circuit 212 without deviating from the present invention. It is only necessary that electrical contacts 214 be in electrical connection with the circuitry of fluid-jet print cartridge 220. Printhead 200 having orifice nozzles 90 is attached to the body 218 and controlled for ejection of fluid droplets, typically by a printer but other recording devices such as plotters, and fax machines, to name a couple, can be used. Thermal fluid-jet print cartridge 220 includes orifice nozzles 90 through which fluid is expelled in a controlled pattern during printing. Conductive drivelines for each resistor component are carried upon flexible circuit 212 mounted to the exterior of print cartridge body 218. Circuit contact pads 214 (shown enlarged in FIG. 6 for illustration) at the ends of the resistor drive lines engage similar pads carried on a matching circuit attached to a printer (not shown). A signal for firing the transistor is generated by a microprocessor and associated drivers on the printer that apply the signal to the drivelines.

Figure 7:
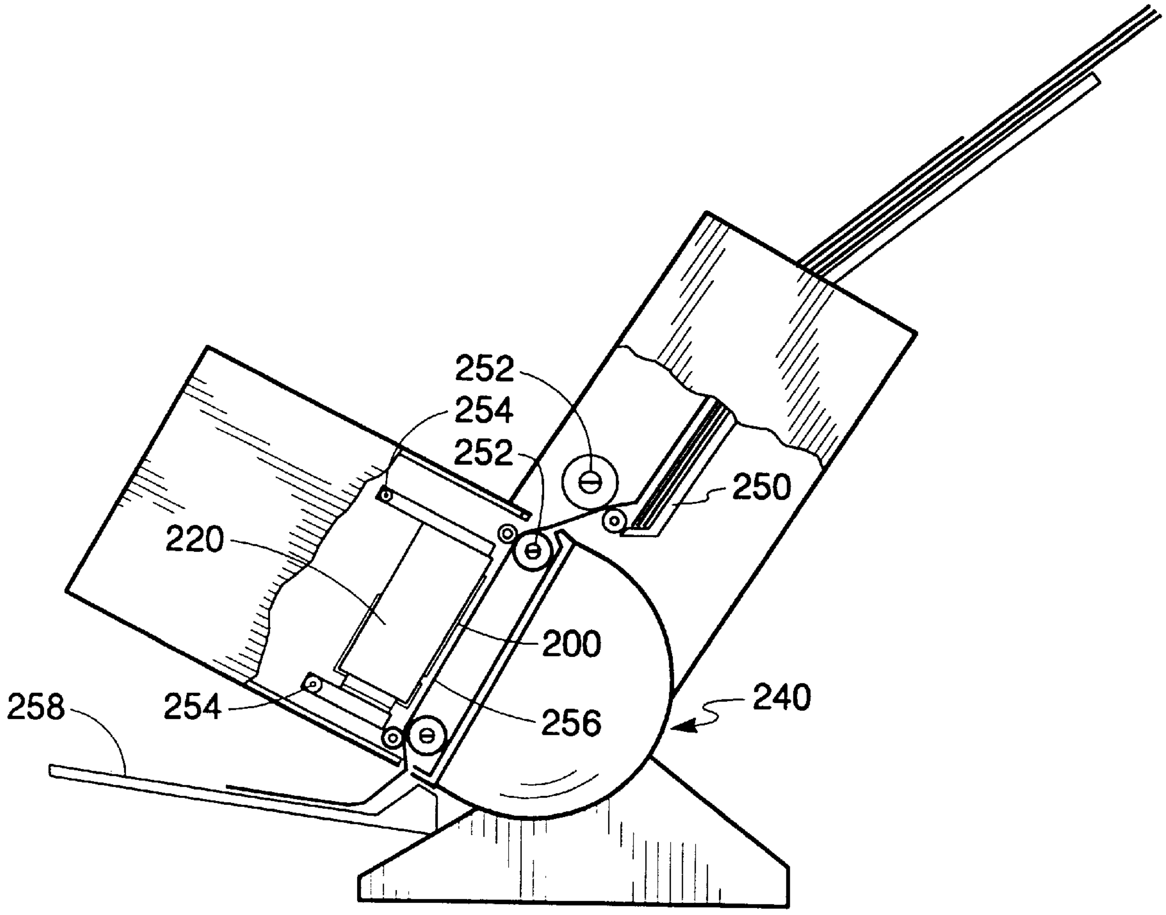
FIG. 7 is an exemplary recoding device, a printer, which uses the print cartridge of FIG. 6.

FIG. 7 is an exemplary recording device, a printer 240, which uses the exemplary print cartridge 220 of FIG. 6. The print cartridge 220 is placed in a carriage mechanism 254 to transport the print cartridge 220 across a first direction of medium 256. A medium feed mechanism 252 transports the medium 256 in a second direction across printhead 220. An optional medium tray 250 is used to hold multiple sets of medium 256. After the medium is recorded by print cartridge 220 using printhead 200 to eject fluid onto medium 256, the medium 256 is optionally placed on media tray 258.

In operation, a droplet of fluid is positioned within fluid chamber 100. Electrical current is supplied to the formed resistive element via conductors 42A and 42B such that the formed resistive element rapidly generates energy in the form of heat. The heat from the formed resistive element is transferred to a droplet of fluid within fluid chamber 100 until the droplet of fluid is "fired" through nozzle 90. This process is repeated several times in order to produce a desired result. During this process, a single dye may be used, producing a single color design, or multiple dyes may be used, producing a multicolor design.

The present invention provides numerous advantages over the conventional printhead. First, the resistor length of the present invention is defined by the placement of dielectric material 44 that is fabricated during a combined photo process and dry etching process. The accuracy of the present process is considerably more controllable than conventional wet etch processes. More particularly, the present process is more controllable in critical dimension control of the resistor than a conventional process. With the current generation of low drop weight, high-resolution printheads, resistor lengths have decreased from approximately 35 micrometers to less than approximately 10 micrometers. Thus, resistors size variations can significantly affect the performance of a printhead. Resistor size variations translate into drop weight and turn on energy variations across the resistor on a printhead. Thus, the improved length control of the resistive material layer yields a more consistent resistor size and resistance, which thereby improves the consistency in the drop weight of a fluid droplet and the turn on energy necessary to fire a fluid droplet.

Second, the resistor structure of the present invention includes a completely flat top surface and does not have the step contour associated with conventional fabrication designs. A flat structure provides consistent bubble nucleation, better scavenging of the fluid chamber, and a flatter topology, thereby improving the adhesion and lamination of the barrier structure to the thin film.

Third, by introducing heat into the floor of the entire fluid chamber, fluid droplet ejection efficiency is improved. Additionally, the passivation and cavitation layers have reduced stress points during thermal cycling.

Fourth, due to the encapsulation and cladding of conductive layer 40 by resistive layer 30, electro-migration of the conductive layer 40 is minimized in the resistor area as well as increasing resistance to corrosion during thin-film processing.

Further, by attaching the printhead 200 to the fluid cartridge 220, the combination forms a convenient module that can be packaged for sale.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method for creating a planar resistor on a substrate surface, comprising the steps of:

depositing a insulator layer on the substrate surface;

depositing an elevated layer on the insulator surface;

depositing a first dielectric layer on the insulator layer;

depositing a conductor layer on the first dielectric layer wherein a portion of the conductor layer is elevated over the elevated layer;

patterning the conductor layer to define a resistor area within a portion of the elevated conductor layer;

etching the patterned conductor layer to form a resistor area, having a resistor length dimension;

applying a second dielectric layer to fill the resistor area and cover the patterned conductor layer;

planarizing the second dielectric layer to expose the elevated conductor layer to form a planar resistor area;

depositing a resistive layer on the planar resistor area;

patterning the resistive layer to define a resistor width dimension; and etching the resistive layer to form the resistor width.

2. A method for creating a printhead, comprising the steps of:

creating a planar resistor of claim 1; and applying at least one layer defining a fluid chamber on the planar resistor.

3. The method of claim 2, further comprising the step of depositing a planar passivation layer between the planar resistor and the fluid chamber.

4. The method of claim 3, further comprising the step of depositing a planar cavitation layer between the planar passivation layer and the fluid chamber.

5. A resistor for a fluid-jet printhead made with the method of claim 1.

6. A printhead made with the method of claim 2.

7. A method for using the planar resistor created by the method of claim 1, comprising the steps of:

combining at least one layer defining a fluid chamber for ejecting fluid on the planar resistor;

supplying fluid into the fluid chamber; and wherein the planar resistor is capable of being activated to thereby heat the fluid and cause it to be ejected from the fluid chamber.

8. A method of using the printhead of claim 6, comprising the steps of attaching the printhead to a fluid container having a fluid conduction path that makes fluidic contact with the fluid chamber.

9. The method using the printhead of claim 8, further comprising the step of combining the attached printhead and fluid cartridge with a printing mechanism.

* * * * *